(12) United States Patent
Jeong et al.

(10) Patent No.: US 7,803,699 B2
(45) Date of Patent: Sep. 28, 2010

(54) POLYSILICON THIN FILM TRANSISTOR AND METHOD OF FABRICATING THE SAME

(75) Inventors: Jae Kyeong Jeong, Yongin-si (KR); Hyun Soo Shin, Yongin-si (KR); Yeon Gon Mo, Yongin-si (KR)

(73) Assignee: Samsung Mobile Display Co., Ltd., Gyeonggi-do (KR)

( * ) Notice: Subject to any disclaimer, the term of this patent is extended or adjusted under 35 U.S.C. 154(b) by 78 days.

(21) Appl. No.: 11/507,606

(22) Filed: Aug. 22, 2006

(65) Prior Publication Data
US 2007/0040175 A1    Feb. 22, 2007

(30) Foreign Application Priority Data
Aug. 22, 2005  (KR) .................. 10-2005-0076975

(51) Int. Cl.
*H01L 21/20* (2006.01)
(52) U.S. Cl. ................. 438/486; 257/E21.134
(58) Field of Classification Search ........... 438/486, 438/482; 257/66, E21.133, E21.134
See application file for complete search history.

(56) References Cited

U.S. PATENT DOCUMENTS

| | | | | |
|---|---|---|---|---|
| 4,469,527 A * | 9/1984 | Sugano et al. | ............... | 438/166 |
| 5,897,347 A * | 4/1999 | Yamazaki et al. | ............ | 438/166 |
| 6,140,165 A * | 10/2000 | Zhang et al. | ................. | 438/166 |
| 7,037,811 B1 * | 5/2006 | Yamazaki et al. | ........... | 438/487 |
| 7,078,321 B2 * | 7/2006 | Yoshimoto | .................. | 438/486 |
| 7,192,818 B1 * | 3/2007 | Lee et al. | ..................... | 438/166 |
| 2002/0013114 A1 * | 1/2002 | Ohtani et al. | .................. | 445/23 |
| 2002/0118322 A1 * | 8/2002 | Murade | ....................... | 349/110 |
| 2003/0042486 A1 * | 3/2003 | Sano et al. | ..................... | 257/49 |
| 2003/0061984 A1 * | 4/2003 | Maekawa et al. | ............... | 117/4 |
| 2004/0171177 A1 * | 9/2004 | Dokumaci et al. | ............. | 438/2 |
| 2004/0178412 A1 * | 9/2004 | Lai et al. | ....................... | 257/72 |
| 2004/0235276 A1 * | 11/2004 | Lin | ............................. | 438/487 |
| 2005/0012096 A1 * | 1/2005 | Yamazaki et al. | ............. | 257/57 |
| 2005/0019990 A1 * | 1/2005 | Chang | .......................... | 438/149 |
| 2005/0048706 A1 * | 3/2005 | Shimomura et al. | ......... | 438/197 |
| 2005/0087772 A1 * | 4/2005 | Yamazaki | .................... | 257/213 |
| 2005/0095755 A1 * | 5/2005 | Nakata et al. | ............... | 438/151 |
| 2005/0095842 A1 * | 5/2005 | Ishikawa et al. | ............ | 438/625 |
| 2005/0148119 A1 * | 7/2005 | Fujimura | .................... | 438/141 |
| 2005/0156239 A1 * | 7/2005 | Seko et al. | .................... | 257/347 |
| 2005/0236622 A1 * | 10/2005 | Jung et al. | ..................... | 257/66 |
| 2006/0033107 A1 * | 2/2006 | Lee et al. | ....................... | 257/66 |
| 2006/0088986 A1 * | 4/2006 | Lin et al. | ..................... | 438/482 |
| 2006/0134891 A1 * | 6/2006 | Ohnuma et al. | ............. | 438/482 |

(Continued)

FOREIGN PATENT DOCUMENTS

JP         08008334     *   1/1996

(Continued)

*Primary Examiner*—W. David Coleman
*Assistant Examiner*—Latanya Crawford
(74) *Attorney, Agent, or Firm*—Lee & Morse P.C.

(57) ABSTRACT

A polysilicon thin film transistor (TFT) may include a substrate, at least one insulating layer, a semiconductor layer, a gate electrode, a source electrode, a drain electrode, and a heat retaining layer formed to contact the semiconductor layer. The heat retaining layer may reduce and/or prevent a reduction in a melt duration time of amorphous silicon during a crystallization process for forming a polysilicon layer of the TFT.

17 Claims, 4 Drawing Sheets

U.S. PATENT DOCUMENTS

2007/0085169 A1 * 4/2007 Hara et al. .................. 257/604

FOREIGN PATENT DOCUMENTS

| JP | 08008334 A * | 1/1996 |
| JP | 2001-267268 | 9/2001 |
| KR | 10-2004-0070979 | 8/2004 |
| WO | WO 03/094243 | 11/2003 |

* cited by examiner

POLYSILICON THIN FILM TRANSISTOR AND METHOD OF FABRICATING THE SAME

BACKGROUND OF THE INVENTION

1. Field of the Invention

The invention relates to polysilicon thin film transistors (TFTs) and a method of fabricating the same. More particularly, the invention relates to polysilicon TFTs and methods of fabricating TFTs employing a heat retaining layer to prevent and/or decrease a reduction in a melt duration time of an amorphous silicon layer when the amorphous silicon layer is exposed to light during, e.g., a crystallization process. The heat retaining layer may be formed on the amorphous silicon layer, and may be capable of absorbing heat and/or blocking heat so as to help maintain and/or increase a melt duration time of the amorphous silicon layer during a crystallization process for forming a polysilicon layer.

2. Discussion of Related Art

In general, the mobility of electrons of a thin film transistor (TFT) including a polysilicon layer is larger than the mobility of electrons of a TFT including an amorphous silicon layer. Thus, high precision and high integration can be more easily obtained with TFTs including a polysilicon layer rather than an amorphous silicon layer. To form the polysilicon layer, intrinsic amorphous silicon may be deposited on an insulating substrate to a thickness of 40 nm to 200 nm by a predetermined method, i.e., a plasma chemical vapor deposition or a low pressure CVD (LPCVD) method, and then crystallized to form the polysilicon layer.

The crystallization method may include a laser annealing method, a solid phase crystallization (SPC) method, a metal induced crystallization (MIC) method, and a metal induced lateral crystallization (MILC) method. Among them, the laser annealing method is widely studied as a method of forming a polysilicon layer. In accordance with the laser annealing method, laser energy is supplied to a substrate on which an amorphous silicon layer is deposited to melt the amorphous silicon layer, and then, the amorphous silicon layer is cooled to form a polysilicon layer.

A conventional polysilicon TFT will be described in detail with reference to FIG. 1, which illustrates a cross-sectional view of a conventional polysilicon TFT.

As illustrated in FIG. 1, the conventional polysilicon TFT may include a substrate 10, a buffer layer 11 formed on the substrate 10, and a semiconductor layer formed on the buffer layer 11. The semiconductor layer may include a polysilicon layer 12 having protrusions 14 formed at grain boundaries.

A gate insulating layer 13 may be formed on the semiconductor layer, and a gate electrode 16 may be formed on the gate insulating layer 13. An interlayer insulating layer 17 may be formed on the gate electrode 16. The interlayer insulating layer 17 may be etched so that source and drain electrodes 18a and 18b formed on the interlayer insulating layer 17 and the semiconductor layer may be electrically connected to each other through contact holes that expose a region of the semiconductor layer.

A process of crystallizing the semiconductor layer of the conventional polysilicon TFT will be described. First, the buffer layer 11 is formed on the substrate 10 and the amorphous silicon layer is formed on the buffer layer 11. The substrate 10 may be formed of glass or plastic.

Next, laser light may be radiated onto the substrate 10, and the buffer layer 11 and the amorphous silicon layer may be laminated by the excimer laser annealing method. The amorphous silicon layer being irradiated with laser light may be crystallized to form the polysilicon layer 12. During the crystallization processes, in a state where laser light is instantaneously absorbed by the amorphous silicon layer and the amorphous silicon layer is melted to an almost liquid state, crystal growth may be performed from a crystal seed that is not melted. Grain boundaries may be formed where a crystal meets adjacent crystals, and the amorphous silicon layer may be phase transformed to the polysilicon layer 12. When silicon is phase transformed from liquid to solid, the density of silicon is reduced and the volume thereof increases. Therefore, the grain boundaries where the crystals meet generally protrude in the form of a peak or mountain, thereby forming protrusions 14. The protrusions 14 may have a height of about 40 nm to about 200 nm, which may be almost equal to a height of the amorphous silicon layer.

The protrusions 14 deteriorate the interface characteristics of the channel of the TFT, and may further affect the characteristics and degree of dispersion of a device employing such a TFT.

As described above, in the conventional art, the amorphous silicon layer is formed on the glass substrate and is crystallized using laser light to form the polysilicon layer of a TFT. However, with increasing interest in flexible displays, technology for manufacturing TFTs using a conductive substrate is being researched.

When a TFT is fabricated using a conductive substrate, a thermal conductivity of the conductive substrate will generally be larger than that of a glass substrate. For example, stainless steel may be employed as a conductive substrate. The thermal conductivity of stainless steel is about 16.3 W/mK, which is about 10 times larger than the thermal conductivity of about 1.38 W/mK for a glass substrate. Therefore, when a semiconductor layer on a conductive substrate is exposed to laser light to crystallize the semiconductor layer, heat loss may increase and a melt duration time of the amorphous silicon layer may be significantly shorter than a melt duration time of an amorphous silicon layer formed on a glass substrate. As a result of the shorter melt duration time, crystal properties of the polysilicon layer may deteriorate and it may be difficult to fabricate a TFT having a mobility of about 100 $cm^2/V_{sec}$ or more.

SUMMARY OF THE INVENTION

The invention is therefore directed to a polysilicon thin film transistor (TFT) and a method of forming such TFTs, which substantially overcome one or more of the problems due to the limitations and disadvantages of the related art.

It is therefore a feature of embodiments of the invention to provide a method of fabricating such a polysilicon TFT capable of decreasing and/or preventing a reduction in a melt duration time of an amorphous silicon layer during a crystallization process where the amorphous silicon layer is transformed to a polysilicon layer.

It is therefore a feature of embodiments of the invention to provide a method of fabricating such a polysilicon TFT formed on a conductive substrate, which is capable of decreasing and/or preventing a reduction in a melt duration time of an amorphous silicon layer during a crystallization process where the amorphous silicon layer is exposed to laser light to form a polysilicon layer.

It is a separate feature of embodiments of the invention to provide a polysilicon TFT and a method of fabricating such a polysilicon TFT including a polysilicon layer having a flat or a height of 20 nm and below surface with a reduced amount and/or no protrusions at grain boundaries of the polysilicon layer.

At least one of the above and other features and advantages of the present invention may be realized by providing a polysilicon thin film transistor (TFT) including a substrate, at least one insulating layer, a semiconductor layer, a gate electrode, a source electrode, a drain electrode, and a heat retaining layer formed to contact the semiconductor layer.

The substrate may be a conductive substrate. The semiconductor layer may be on the conductive substrate, the heat retaining layer may be on the semiconductor layer, the first insulating layer may be on the heat retaining layer, the gate electrode may be on the first insulating layer at a position corresponding to the semiconductor layer, the second insulating layer may include at least one contact hole and may be on the gate electrode, and the source and drain electrodes may be on the second insulating layer and be electrically connected to the semiconductor layer through the contact holes.

The gate electrode may be on the conductive substrate, the insulating layer may be on the gate electrode, the semiconductor layer may be on the insulating layer at a position corresponding to the gate electrode, the heat retaining layer may be on the semiconductor layer, and the source and drain electrodes may be on both ends of the heat retaining layer and may be electrically connected to the semiconductor layer by ohmic contact layers. The heat retaining layer may include $SiO_xN_y$. The heat retaining layer may have a thickness of about 0.1 µm to about 1 µm.

The polysilicon TFT may include an $SiO_2$ layer between the semiconductor layer and the heat retaining layer. THE $SiO_2$ layer may have a thickness of about 50 nm to about 500 nm. The substrate may be a conductive substrate including at least one of stainless steel, titanium, molybdenum, iron and cobalt. The polysilicon TFT may include a lower insulating layer on another surface of the substrate that is opposite to a surface on which the semiconductor layer is located. The semiconductor layer may include a polysilicon layer and the heat retaining layer may be on a surface of the polysilicon layer that includes protrusions having a height of 20 nm and below.

At least one of the above and other features and advantages of the invention may be separately realized by providing a method of fabricating a polysilicon TFT including providing a conductive substrate, forming a buffer layer on the conductive substrate, forming an amorphous silicon layer on the buffer layer, forming a heat retaining layer on the amorphous silicon layer, crystallizing the amorphous silicon layer to form a polysilicon layer, forming a first insulating layer on the polysilicon layer, forming a gate electrode on the first insulating layer at a position corresponding to the polysilicon layer, forming a second insulating layer including at least one contact hole on the gate electrode, and forming source and drain electrodes electrically connected to the polysilicon layer through the at least one contact hole of the second insulating layer.

The method may further include removing the heat retaining layer before forming the first insulating layer. The heat retaining layer may be removed by wet etching or dry etching. The method may further involve forming a $SiO_2$ layer after forming the amorphous silicon layer and before forming the heat retaining layer. The $SiO_2$ layer and the heat retaining layer may be removed during a same process of, e.g., wet etching or dry etching.

The $SiO_2$ layer and the heat retaining layer may be etched using, e.g., hydrogen fluoride. The polysilicon layer may be formed by an excimer laser annealing (ELA) method. A time for which the amorphous silicon layer is exposed to laser light may range from about 30 ns to about 200 ns.

At least one of the above and other features and advantages of the invention may be separately realized by providing a method of fabricating a polysilicon TFT, including providing a conductive substrate, forming a gate electrode in a region on the conductive substrate, forming an insulating layer on the gate electrode, forming an amorphous silicon layer on the insulating layer in the position corresponding to the gate electrode, forming a heat retaining layer on the amorphous silicon layer, crystallizing the amorphous silicon layer to a polysilicon layer by laser, forming ohmic contact layers on both ends of the polysilicon layer, and forming source and drain electrodes on the ohmic contact layers, the source and drain electrodes being electrically connected to the polysilicon layer.

The method may further include removing the heat retaining layer before forming the ohmic contact layers.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
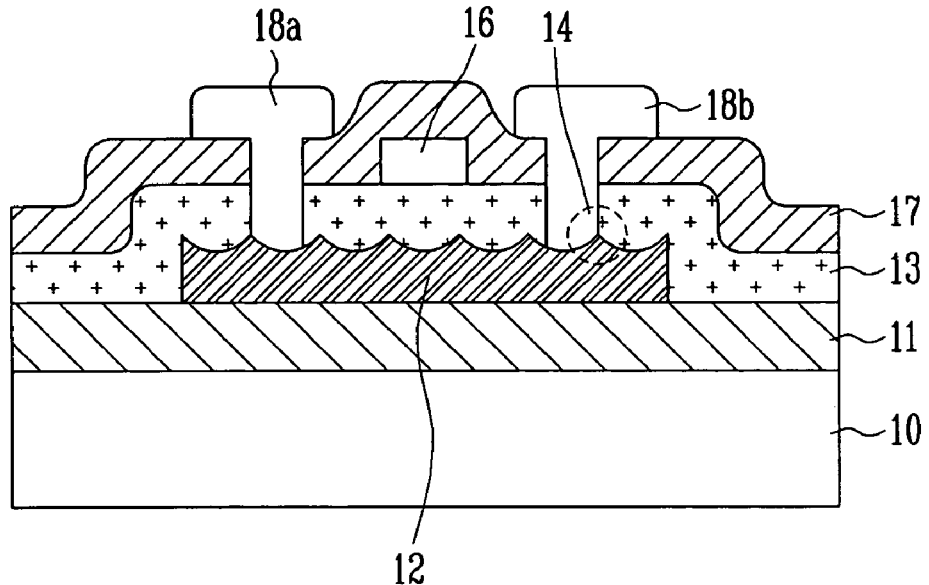
FIG. 1 illustrates a cross-sectional view of a conventional polysilicon thin film transistor (TFT)

Korean Patent Application No. 2005-0076975, filed on Aug. 22, 2005, in the Korean Intellectual Property Office, and entitled: "Polysilicon Thin Film Transistor and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, a polysilicon thin film transistor (TFT) and a method of fabricating the same according to exemplary embodiments of the invention will be described with reference to the attached drawings.

Figure 2:
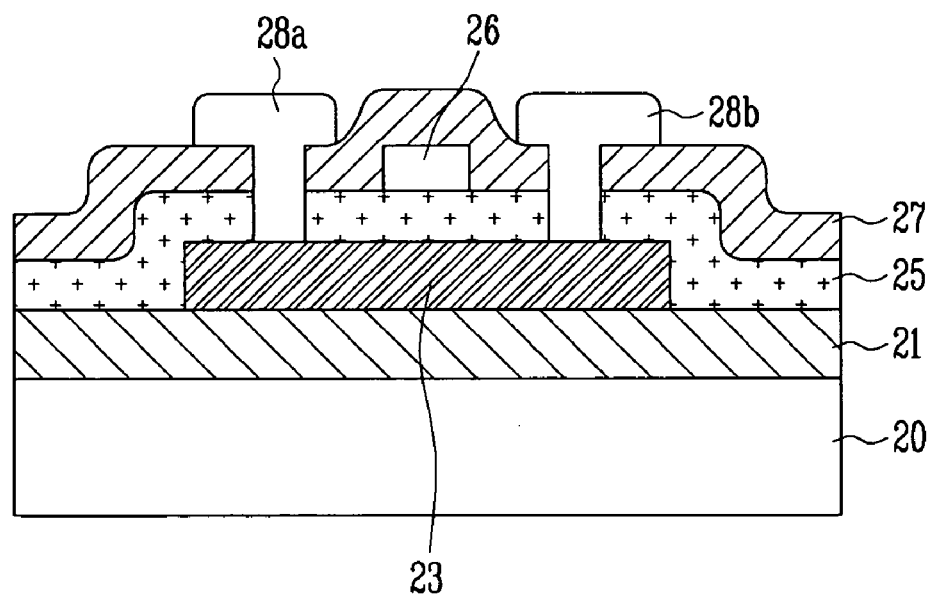
FIG. 2 illustrates a cross-sectional view of a coplanar polysilicon TFT according to a first embodiment of the invention.

FIG. 2 illustrates a cross-sectional view of a coplanar polysilicon TFT according to a first exemplary embodiment of the invention.

As illustrated in FIG. 2, a polysilicon TFT, according to a first exemplary embodiment of the invention, may include a buffer layer 21 formed on a substrate 20, and a semiconductor layer formed on the buffer layer 21. The semiconductor layer may include a lightly doped drain (LDD) layer (not shown) between an active channel region (not shown) and source and drain regions (not shown). The semiconductor layer may be a polysilicon layer 23. The semiconductor layer, e.g., polysilicon layer 23, may be formed so that a height of the protrusions formed on grain boundaries is 20 nm or less.

A first insulating layer 25 and a gate electrode 26 may be patterned to be sequentially formed on the polysilicon layer 23. A second insulating layer 27 may be formed on the gate electrode 26. The second insulating layer 27 may include contact holes that expose portions of the source and drain regions (not shown) in the polysilicon layer 23. Source and drain electrodes 28a and 28b may be formed on the second insulating layer 27, and may respectively contact the exposed source and drain regions through the respective contact holes in the second insulating layer 27.

FIGS. 3A to 3E illustrate cross-sectional views of an exemplary process of crystallizing the semiconductor layer according to the first embodiment of the present invention.

Figure 3A:
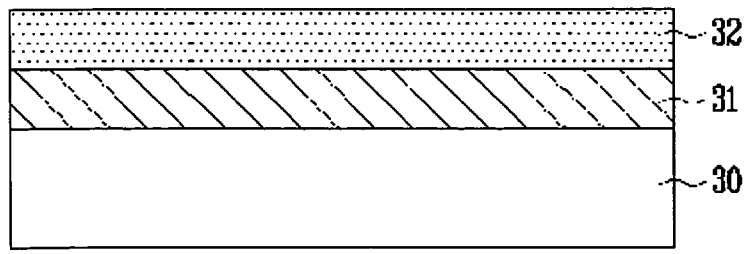
FIGS. 3A to 3E illustrate cross-sectional views of resulting structures corresponding to stages in a method of crystallizing a semiconductor layer according to the first embodiment of the invention.

As illustrated in FIG. 3A, a buffer layer 31 and an amorphous silicon layer 32 may be sequentially laminated on a conductive substrate 30. The conductive substrate 30 may be formed of a conductive material(s), e.g., stainless steel, titanium, molybdenum, iron, and cobalt.

The buffer layer 31 may be formed, e.g., of an inorganic insulating material, e.g., $SiO_2$ and $SiN_x$, or an organic insulating material, e.g., an acrylic organic compound, polyamide and polyimide.

Since crystals in an amorphous silicon layer 32 lack periodic characteristics, movement of electrons may be hindered and/or prohibited such that high resistivity and low mobility may be obtained.

Figure 3B:
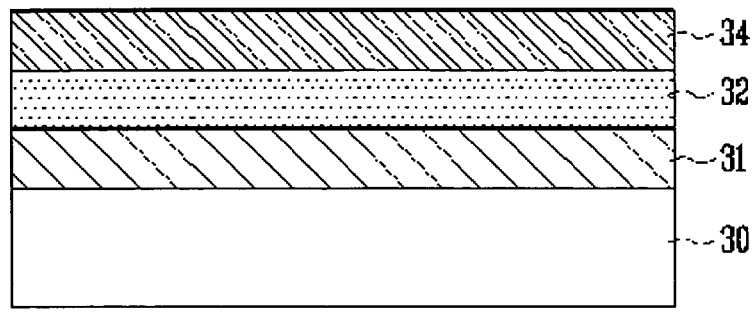

Next, as illustrated in FIG. 3B, a heat retaining layer 34 may be deposited on the conductive substrate 30. For example, the heat retaining layer 34 may be formed on a portion of the conductive substrate 30 where the buffer layer 31 and the amorphous silicon layer 32 are laminated. The heat retaining layer 34 may be formed on the amorphous silicon layer 32. The heat retaining layer 34 may be formed of a highly thermally conductive material, e.g., $SiO_xN_y$. The heat retaining layer 34 may absorb heat from, e.g., laser light incident thereon.

In embodiments of the invention, the heat retaining layer 34 may have high thermal conductivity and may be formed to have a thickness of about 0.1 µm to about 1 µm. In exemplary embodiments of the invention, when a thickness of the heat retaining layer 34 is greater than about 1 µm, the benefits of employing a heat retaining layer 34 during a crystallization process, i.e., process of transforming amorphous silicon into polysilicon, may be outweighed by a deposition time and a cost of forming such a heat retaining layer 34 having a thickness greater than about 1 µm. An amount of stress on the substrate 30 as a result of the heat retaining layer, e.g., $SiO_xN_y$, layer may rapidly increase when a thickness of the heat retaining layer 34 is greater than about 1 µm. In exemplary embodiments of the invention, when the thickness of the heat retaining layer 34 is less than about 0.1 µm, such thickness of the heat retaining layer 34 may not enable the heat retaining layer 34 to absorb a sufficient amount of heat from, e.g., laser light incident thereon, such that any advantage resulting from an increase in an amount of time silicon remains in a liquid state during a crystallization process may not outweigh a time and/or cost of forming the heat retaining layer 34.

Figure 3C:
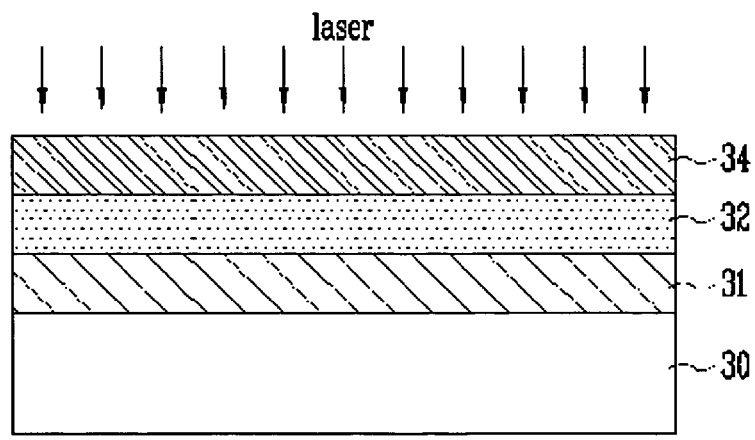

As illustrated in FIG. 3C, laser light may be radiated onto the conductive substrate 30. For example, laser light may be radiated on a portion of the conductive substrate where the buffer layer 31, the amorphous silicon layer 32 and the heat retaining layer 34 are formed. Laser light may be radiated by an excimer laser annealing (ELA) method. An object of crystallization using the ELA method may be to control a heat transfer and a solidification velocity during a solidification process that occurs after melting of the amorphous silicon layer 32. To control the heat transfer and solidification velocity, the thickness of the buffer layer 31, the number of times at which a laser beam is radiated and/or the shape of the laser beam may be controlled. In embodiments of the invention, a time period for exposing the amorphous silicon layer 32 to laser light may range from about 30 ns to about 200 ns.

The heat retaining layer 34 may absorb laser photons to retain heat and increase the melt duration time of the amorphous silicon layer 32 during a crystallization process. As discussed above, during a crystallization process, the amorphous silicon layer 32 may be exposed to, e.g., laser light, in order to melt the amorphous silicon layer 32, before allowing the melted amorphous silicon layer 32 to cool and crystallize into a polysilicon layer. By providing the heat retaining layer 34, the amorphous silicon layer may be transformed to a polysilicon layer in a manner that is advantageous for crystal growth.

Figure 3D:
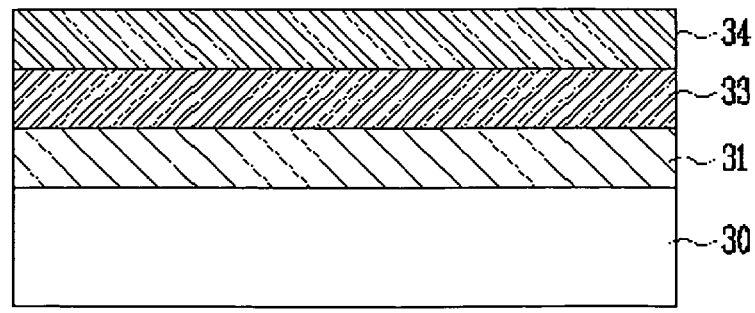

Then, as illustrated in FIG. 3D, laser light may be radiated onto the conductive substrate 30 where the buffer layer 31, the amorphous silicon layer 32, and the heat retaining layer 34 may be formed so that the amorphous silicon layer may be crystallized to a polysilicon layer 33.

When the polysilicon layer 33 is employed as the semiconductor layer, an operational speed of the TFT may be, e.g., about 100 to 200 times higher than that of a TFT employing an amorphous silicon layer as the semiconductor layer. A TFT employing the polysilicon layer 33 as the semiconductor layer may operate very fast and may enable the TFT to operate in association with an external high speed driving integrated circuit. Such a TFT may be used as a switching device suitable for displaying real time image information associated with a relatively large area.

In embodiments of the invention, the heat retaining layer 34 may prevent and/or reduce protrusions from being formed on grain boundaries during an ELA process. Embodiments of the invention may enable the semiconductor layer to have a smooth surface.

Figure 3E:
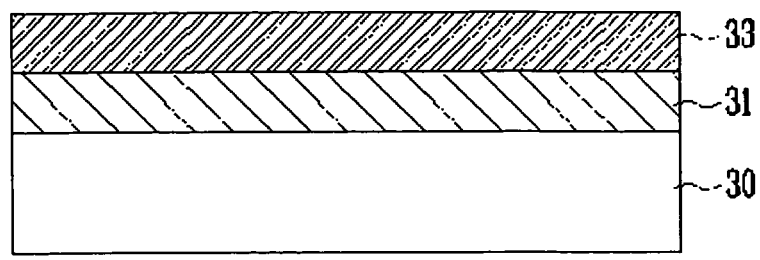

Next, as illustrated in FIG. 3E, after the semiconductor layer is crystallized to form the polysilicon layer 33, the heat retaining layer may be removed by, e.g., wet etching or dry etching.

As described above, since an ELA process may be performed after forming a heat retaining layer on a conductive substrate, the heat retaining layer may absorb heat, e.g., heat from laser light incident thereon, to increase a melt duration time of an amorphous silicon layer, to reduce and/or prevent protrusions from being formed in the semiconductor layer, and to provide a semiconductor layer having a smooth surface on which, e.g., an insulating layer and/or electrodes may be formed.

FIGS. 4 to 8 illustrate cross-sectional views of additional exemplary embodiments of polysilicon TFTs employing one or more aspects of the present invention. In the following description of the exemplary embodiments illustrated in FIGS. 4 to 8, only differences between the respective exemplary embodiments and the first exemplary embodiment described with reference to FIG. 2 will be described. In particular, a detailed description of a laser crystallizing method, and respective layers of the TFT will be omitted.

Figure 4:
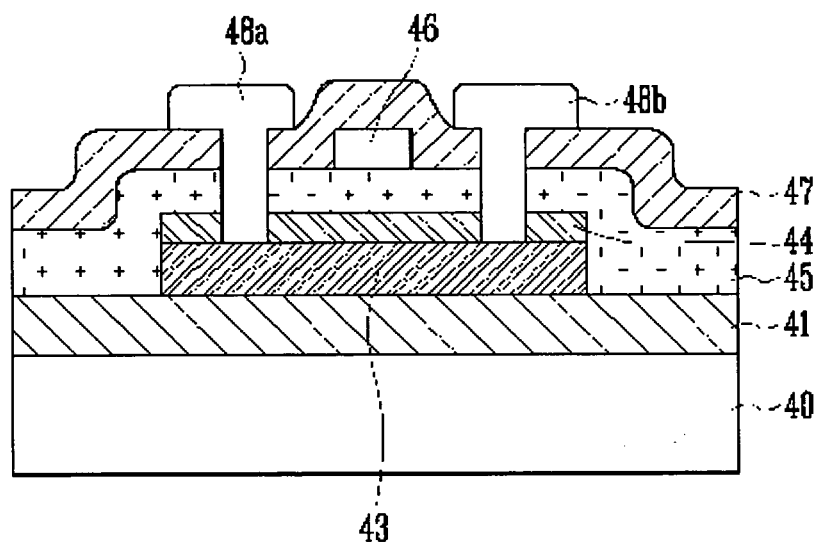
FIG. 4 illustrates a cross-sectional view of a coplanar polysilicon TFT according to a second embodiment of the invention.

FIG. 4 illustrates a cross-sectional view of a coplanar polysilicon TFT according to a second embodiment of the present invention.

As illustrated in FIG. 4, a buffer layer 41 may be formed on a substrate 40, e.g., a conductive substrate, and a polysilicon layer 43 may be formed on the buffer layer 41. The polysilicon layer 43 may be formed from an amorphous silicon layer crystallized by an ELA method. A heat retaining layer 44 may be sequentially formed on the polysilicon layer 43. In the exemplary embodiment illustrated in FIG. 4, after the ELA process, the heat retaining layer 44 is maintained and not removed. The heat retaining layer 44 may be used as an insulating layer.

A first insulating layer 45 may be formed on the heat retaining layer 44, and a gate electrode 46 may be formed on the first insulating layer 45.

The gate electrode 46 may be formed at a predetermined position relative to the polysilicon layer 43. A second insulating layer 47 including, e.g., one or more contact holes may be formed on the gate electrode 46. Source electrode 48a and drain electrode 48b may be electrically connected to the polysilicon layer 43 through the contact holes formed in the second insulating layer 47.

Figure 5:
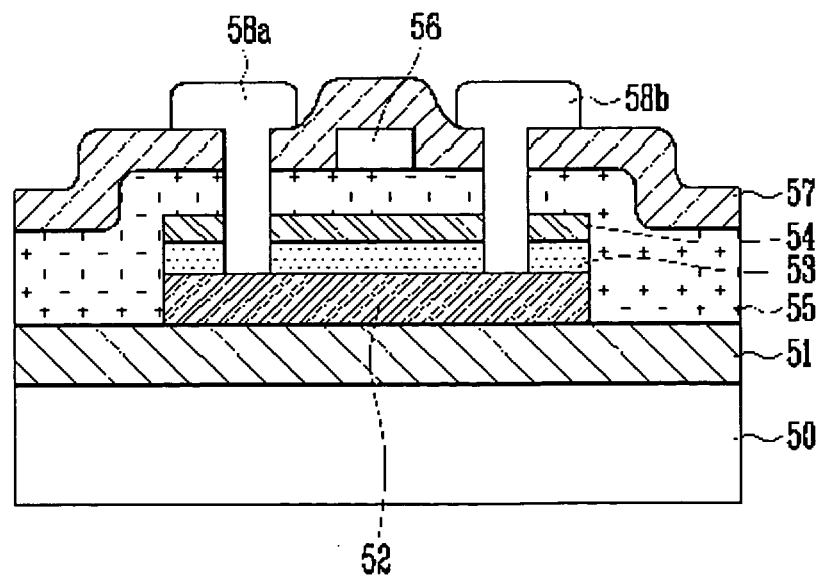
FIG. 5 illustrates a cross-sectional view of a coplanar polysilicon TFT according to a third embodiment of the invention.

FIG. 5 illustrates a cross-sectional view of a coplanar polysilicon TFT according to a third exemplary embodiment of the invention.

Referring to FIG. 5, a buffer layer 51 may be formed on a substrate 50, e.g., a conductive substrate, and a polysilicon layer 52 may be formed on the buffer layer 51. A SiO$_2$ layer 53 may be formed on the polysilicon layer 52, and a heat retaining layer 54 may be formed on the SiO$_2$ layer 53. The SiO$_2$ layer 53 may have a thickness of about 50 nm to about 500 nm.

A first insulating layer 55 may be formed on the heat retaining layer 54, and a gate electrode 56 may be formed on the first insulating layer 55. The gate electrode 56 may be formed at a predetermined position relative to the polysilicon layer 52. A second insulating layer 57 including, e.g., one or more contact holes may be formed on the gate electrode 56. Source electrode 58a and drain electrode 58b may be electrically connected to the polysilicon layer 52 through the contact holes formed in the second insulating layer 57.

In the exemplary embodiment illustrated in FIG. 5, the SiO$_2$ layer 53 is retained after the ELA process is performed. However, in embodiments of the invention, the SiO$_2$ layer 53 may be removed. In embodiments of the invention, the SiO$_2$ layer 53 may facilitate etching of the heat retaining layer 54. In embodiments in which the SiO$_2$ layer 53 is removed, the SiO$_2$ layer 53 may be removed by, e.g., wet-etching and/or dry etching. For example, the SiO$_2$ layer 53 may be etched by hydrogen fluoride.

Figure 6:
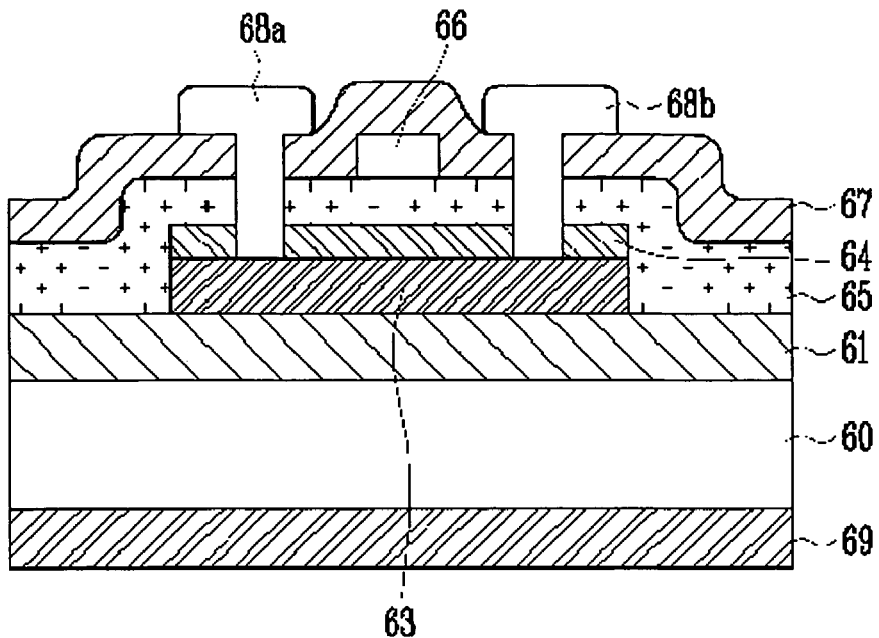
FIG. 6 illustrates a cross-sectional view of a coplanar polysilicon TFT according to a fourth embodiment of the invention.

FIG. 6 illustrates a cross-sectional view of a coplanar polysilicon TFT according to a fourth exemplary embodiment of the invention.

Referring to FIG. 6, a lower insulating layer 69 may be formed on one side, e.g., lower side, of a substrate 60, e.g., a conductive substrate, and a buffer layer 61 may be formed on an opposite side, e.g., upper side, of the substrate 60. A polysilicon layer 63 and a heat retaining layer 64 may be sequentially formed on the buffer layer 61. The lower insulating layer 69 may be formed of a same material as the buffer layer 31 described above with reference to FIG. 3. The lower insulating layer 69 may help reduce stress applied to the substrate 60 during, e.g., the crystallization process.

A first insulating layer 65 may be formed on the heat retaining layer 64, and a gate electrode 66 may be formed on the first insulating layer 65. The gate electrode 66 may be formed at a predetermined position relative to the polysilicon layer 63. A second insulating layer 67 including, e.g., one or more contact holes, may be formed on the gate electrode 66. Source electrode 68a and drain electrode 68b may be electrically connected to the polysilicon layer 63 through contact holes formed on the second insulating layer 67.

Figure 7:
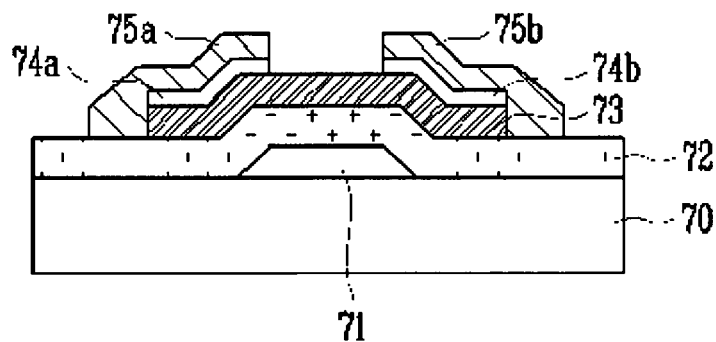
FIG. 7 illustrates a cross-sectional view of a reverse staggered polysilicon TFT according to a fifth embodiment of the invention.

FIG. 7 illustrates a cross-sectional view of a reverse staggered polysilicon TFT according to a fifth embodiment of the invention.

Referring to FIG. 7, a gate electrode 71 may be formed on a substrate 70, e.g., conductive substrate. An insulating layer 72 may be formed on the gate electrode 71, and an amorphous silicon layer may be formed on the insulating layer 72 at a predetermined position relative to the gate electrode 71. During processing, e.g., a heat retaining layer (not shown) may be formed on the amorphous silicon layer and may block and/or reduce an amount of heat applied to the amorphous silicon layer when laser light is irradiated toward the amorphous silicon layer. After cooling of the laser irradiated amorphous silicon layer and the crystallization of the melted amorphous silicon to a polysilicon layer 73, the heat retaining layer may be removed by, e.g., dry etching or wet etching.

In embodiments of the invention in which the heat retaining layer (not shown) is removed, ohmic contact layers 74a and 74b may be formed on both ends of the polysilicon layer 73. Source and drain electrodes 75a and 75b may be formed on the substrate 70, and may be electrically connected to the polysilicon layer 73 via the ohmic contact layers 74a and 74b.

Figure 8:
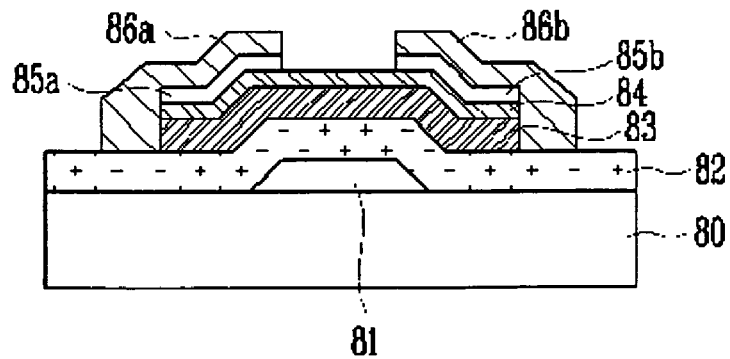
FIG. 8 illustrates a cross-sectional view of a reverse staggered polysilicon TFT according to a sixth embodiment of the invention.

FIG. 8 illustrates a cross-sectional view of a reverse staggered polysilicon TFT according to a sixth exemplary embodiment of the invention. The polysilicon TFT may be formed by a same method as that described, e.g., in relation to the fifth exemplary embodiment of the present invention described with reference to FIG. 7. However, after the semiconductor layer is crystallized to form a polysilicon layer 83, a heat retaining layer 84 is maintained and not removed. When the heat retaining layer 84 is maintained, i.e., not removed, the heat retaining layer 84 may operate as an insulating layer.

As described above, according to the polysilicon TFT of the embodiments of the present invention, after the semiconductor layer is crystallized, the heat retaining layer may remain or may be removed. Also, according to the embodiments of the present invention, the coplanar and reverse staggered TFTs are described. However, the embodiments of the present invention can be applied to reverse coplanar and staggered TFTs.

As described above, according to one or more aspects of the invention, when a TFT is fabricated using a heat retaining layer formed on the amorphous silicon layer during a crystallization process for crystallizing the amorphous silicon layer into a polysilicon layer, it is possible to prevent and/or decrease a reduction in a melt duration time of the amorphous silicon layer, as a result of heating by, e.g., laser light. Embodiments of the invention improve crystal-properties of the polysilicon layer, and facilitate fabrication of a high mobility transistor.

Embodiments of the invention may help prevent and/or reduce protrusions from being formed at grain boundaries of the polysilicon layer, and thus, may help obtain uniform brightness.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a polysilicon TFT, the method comprising:
    providing a conductive substrate, wherein the conductive substrate is metal;
    forming an insulating layer on the conductive substrate;
    forming an amorphous silicon layer on the insulating layer;
    forming a heat retaining layer on the amorphous silicon layer;
    crystallizing the amorphous silicon layer to form a polysilicon layer;
    forming ohmic contact layers on both ends of the polysilicon layer, the heat retaining layer being removed before the ohmic contact layers are formed;
    forming a gate electrode insulated from the polysilicon layer; and
    forming source and drain electrodes electrically connected to the polysilicon layer and on the ohmic contact layers.

2. The method as claimed in claim 1, wherein the heat retaining layer includes silicon oxynitride.

3. The method as claimed in claim 1, wherein the metal includes at least one of stainless steel, titanium, molybdenum, iron, and cobalt.

4. The method as claimed in claim 1, wherein the heat retaining layer has a thickness of about 0.1 μm to about 1 μm.

5. The method as claimed in claim 1, wherein the polysilicon TFT has a length and a width, and the conductive substrate continuously extends the entire length and width of the polysilicon TFT.

6. The method as claimed in claim 1, wherein:
    forming the gate electrode includes forming the gate electrode in a region on the conductive substrate;
    forming the insulating layer includes forming the insulating layer on the gate electrode;
    forming the amorphous silicon layer includes forming the amorphous silicon layer on the insulating layer in a position corresponding to the gate electrode.

7. The method as claimed in claim 1, further comprising a lower insulating layer formed on another surface of the substrate that is opposite to a surface on which the the amorphous silicon layer is formed.

8. The method as claimed in claim 1, wherein the heat retaining layer is formed on a surface of the polysilicon layer that includes protrusions having a height of 20 nm and below.

9. The method as claimed in claim 1, the method further comprising:
    forming a second insulating layer on the polysilicon layer;
    forming the gate electrode on the second insulating layer at a position corresponding to the polysilicon layer;
    forming a third insulating layer including at least one contact hole on the gate electrode; and
    electrically connecting source and drain electrodes to the polysilicon layer through the at least one contact hole of the third insulating layer.

10. The method as claimed in claim 9, further comprising removing the heat retaining layer before forming the second insulating layer.

11. The method as claimed in claim 9, wherein the polysilicon layer is formed by an excimer laser annealing (ELA) method.

12. The method as claimed in claim 9, wherein time for which the amorphous silicon layer is exposed to laser light ranges from about 30 ns to about 200 ns.

13. The method as claimed in claim 10, wherein the heat retaining layer is removed by wet etching or dry etching.

14. The method as claimed in claim 10, further comprising forming a $SiO_2$ layer after forming the amorphous silicon layer and before forming the heat retaining layer.

15. The method as claimed in claim 14, wherein the $SiO_2$ layer and the heat retaining layer are removed during a same process of wet etching or dry etching.

16. The method as claimed in claim 15, further wherein the $SiO_2$ layer and the heat retaining layer are etched using hydrogen fluoride.

17. The method as claimed in claim 16, wherein the $SiO_2$ layer has a thickness of about 50 nm to about 500 nm.

* * * * *